United States Patent [19]
Lindberg et al.

[11] Patent Number: 5,504,378
[45] Date of Patent: Apr. 2, 1996

[54] DIRECT COOLED SWITCHING MODULE FOR ELECTRIC VEHICLE PROPULSION SYSTEM

[75] Inventors: Frank A. Lindberg, Baltimore; Richard M. Young, Millersville; William B. Hall, Annapolis; Frank E. Altoz, Baltimore; Ngon B. Nguyen, Jessup, all of Md.

[73] Assignee: Westinghouse Electric Corp., Pittsburgh, Pa.

[21] Appl. No.: 258,027

[22] Filed: Jun. 10, 1994

[51] Int. Cl.⁶ .................................................. H05K 7/20
[52] U.S. Cl. .................... 307/10.1; 257/678; 361/699; 361/707; 361/722; 361/735
[58] Field of Search ................................. 307/9.1, 10.1; 180/65.1, 65.8; 310/DIG. 6; 363/141, 144; 174/252; 257/707, 712–714; 361/704, 707, 717–719, 709–713, 720–722, 728, 729, 689, 698, 699, 735, 736, 750, 752, 753; 318/254; 165/104.33

[56] References Cited

U.S. PATENT DOCUMENTS

| | | | |
|---|---|---|---|
| 4,155,402 | 5/1979 | Just ........................................... | 361/699 |
| 4,612,978 | 9/1986 | Cutchaw ................................... | 257/714 |
| 5,053,920 | 10/1991 | Staffiere et al. ......................... | 363/141 |
| 5,227,583 | 7/1993 | Jones ....................................... | 257/678 |
| 5,402,045 | 3/1995 | Mori ........................................ | 318/254 |

Primary Examiner—William M. Shoop, Jr.
Assistant Examiner—Richard T. Elms

[57] ABSTRACT

An apparatus for cooling a switching circuit for an electric vehicle, wherein the switching circuit has at least two switching elements connected in series, includes first and second heat sinks, each having two thermally-conductive planar members forming a passage therebetween for channeling cooling fluid, an inlet port in communication with the passage, and an outlet port in communication with the passage, and a substrate for mounting at least one switching element to each of the first and second heat sinks. An ac terminal connects the switching element attached to the first heat sink in series with the switching element attached to the second heat sink, and inlet and outlet manifolds, coupled to the inlet and outlet ports of the first and second heat sinks, circulate cooling fluid through the passages of the first and second heat sinks to cool the switching elements.

23 Claims, 10 Drawing Sheets

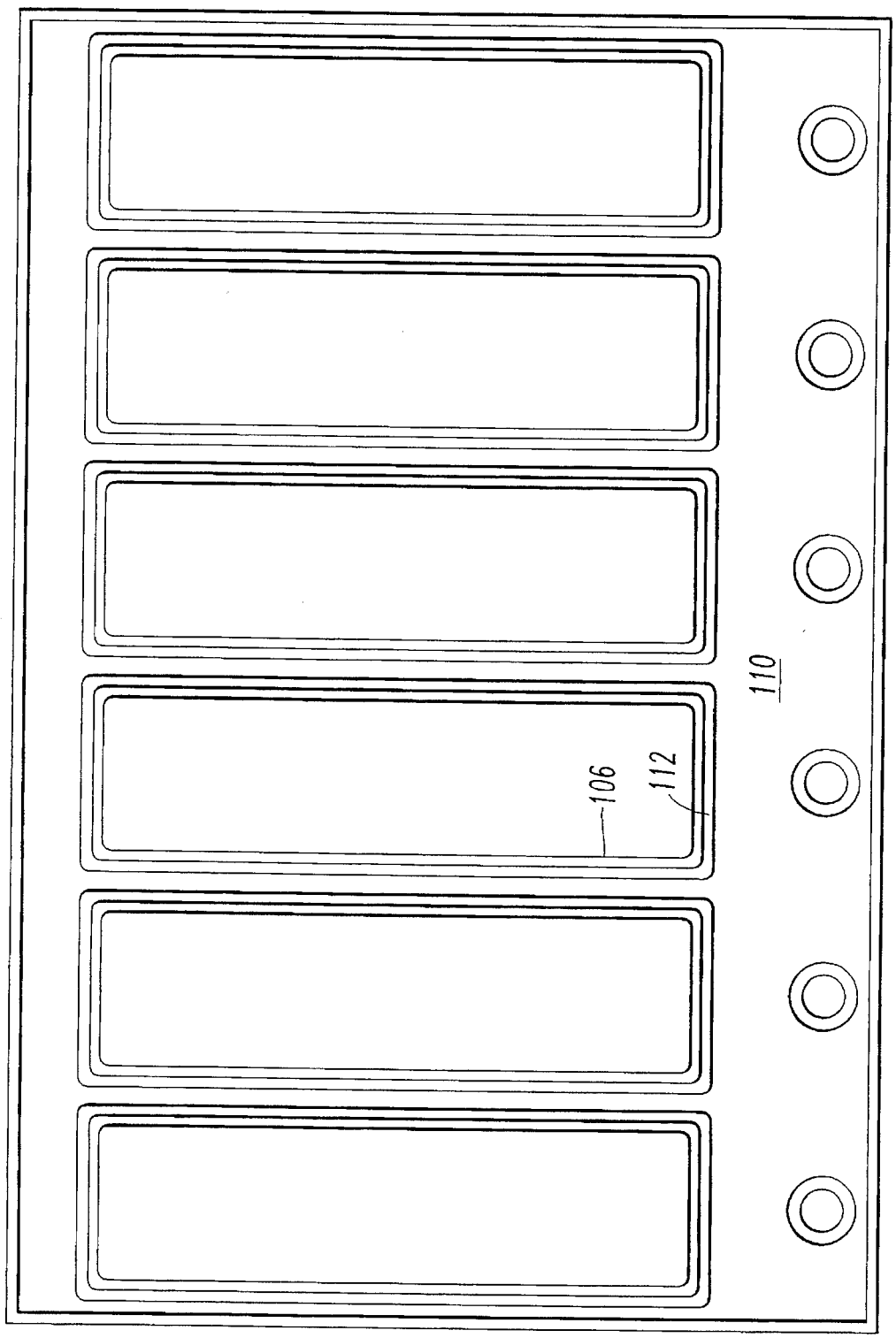

DIRECT COOLED SWITCHING MODULE FOR ELECTRIC VEHICLE PROPULSION SYSTEM

RELATED APPLICATIONS

The following identified U.S. patent applications are filed on the same date as the instant application and are relied upon and incorporated by reference in this application.

U.S. patent application Ser. No. 08/258,295 entitled "Flat Topping Concept";

U.S. patent application Ser. No. 08/258,150 entitled "Electric Induction Motor And Related Method Of Cooling";

U.S. patent application Ser. No. 08/258,142 entitled "Automotive 12 Volt System For Electric Vehicles";

U.S. patent application Ser. No. 08/258,301 entitled "Electric Vehicle Propulsion System";

U.S. patent application Ser. No. 08/258,294 entitled "Speed Control and Bootstrap Technique For High Voltage Motor Control";

U.S. patent application Ser. No. 08/258,306 entitled "Vector Control Board For An Electric Vehicle Propulsion System Motor Controller";

U.S. patent application Ser. No. 08/258,305 entitled "Digital Pulse Width Modulator With Integrated Test And Control";

U.S. patent application Ser. No. 08/258,149 entitled "Control Mechanism For Electric Vehicle";

U.S. patent application Ser. No. 08/258,153 entitled "Improved EMI Filter Topology for Power Inverters";

U.S. patent application Ser. No. 08/258,179 entitled "Fault Detection Circuit For Sensing Leakage Currents Between Power Source And Chassis";

U.S. patent application Ser. No. 08/258,117 entitled "Electric Vehicle Relay Assembly";

U.S. patent application Ser. No. 08/258,033 entitled "Three Phase Power Bridge Assembly";

U.S. patent application Ser. No. 08/258,034 entitled "Electric Vehicle Propulsion System Power Bridge With Built-In-Test";

U.S. patent application Ser. No. 08/258,178 entitled "Method For Testing A Power Bridge For An Electric Vehicle Propulsion System";

U.S. patent application Ser. No. 08/258,157 entitled "Electric Vehicle Power Distribution Module";

U.S. patent application Ser. No. 08/258,628 entitled "Electric Vehicle Chassis Controller";

U.S. patent application Ser. No. 08/258,156 entitled "Electric Vehicle System Control Unit Housing";

U.S. patent application Ser. No. 08/258,299 entitled "Low Cost Fluid Cooled Housing For Electric Vehicle System Control Unit";

U.S. patent application Ser. No. 08/258,296 entitled "Electric Vehicle Coolant Pump Assembly";

U.S. patent application Ser. No. 08/258,141 entitled "Heat Dissipating Transformer Coil";

U.S. patent application Ser. No. 08/258,154 entitled "Electric Vehicle Battery Charger";

BACKGROUND OF THE INVENTION

Field of the Invention

This invention generally relates to switching circuits, and particularly relates to fluid-cooled switching circuits, e.g., insulated gate bipolar transistor (IGBT) circuits, for use in electric vehicles. While the invention is subject to a wide range of applications, it is especially suited for use in electric vehicles that utilize batteries or a combination of batteries and other sources, e.g., a heat engine coupled to an alternator, as a source of power, and will be particularly described in that connection.

Discussion of the Related Art

Due to the importance currently placed on conserving petroleum reserves, achieving energy efficiency, and reducing air pollution, development of electric vehicles has become a priority. Ultimately, to be successful, these vehicles must be safe, inexpensive, efficient, and acceptable to consumers who are used to driving gasoline-powered vehicles.

For an electric vehicle to be commercially viable, its cost and performance should be competitive with that of its gasoline-powered counterparts. Typically, the vehicle's propulsion system and battery are the main factors which contribute to the vehicle's cost and performance competitiveness.

Conventional electric vehicles include a motor, a battery, and a group of electronic components for charging the battery and operating the motor. Although electric vehicles (not including the battery pack) have been designed to be generally lighter than gasoline-powered vehicles, the addition of a suitable battery pack increases the weight of a typical electric vehicle such that a substantial amount of power must be utilized in the motor to move the vehicle. Because of "iron" losses in the magnetic parts of the motor and resistance to the current flow in the electrical conductors of the motor, heat is generated in the motor during use. If this heat is not removed, the potential for failure of the motor components exists.

In order to satisfy performance requirements, the vehicle's propulsion system must incorporate switching circuits that switch large currents to drive the motor. These large currents cause an undesirable generation of heat within the electrical components of conventional electrical vehicles. For example, the motor controller within a conventional electric vehicle system control unit may include a switching circuit having a number of IGBT's, among other components. The IGBT's rapidly switch on and off to direct current flow to the motor, using a substantial amount of current and generating heat. Therefore, some method of removing thermal energy from the IGBT's is required to prevent their potential failure, as well as the potential failure of other electrical components located nearby. A directed flow of air has been used to cool electrical components in conventional electric vehicles. However, such air flow provides insufficient cooling in some situations, particularly in high-performance applications.

SUMMARY OF THE INVENTION

Accordingly, the present invention is directed to a fluid-cooled switching module for an electric vehicle that substantially obviates one or more of the problems due to the limitations and disadvantages of the related art.

Features and advantages of the invention will be set forth in the description which follows, and in part will be apparent from the description, or may be learned by practice of the invention. The objectives and other advantages of the invention will be realized and attained by the apparatus particularly pointed out in the written description and claims thereof as well as the appended drawings.

To achieve these and other advantages and in accordance with the purpose of the invention, as embodied and broadly described, the invention provides for apparatus comprising first and second heat sinks, each having two thermally-conductive planar members forming a passage therebetween for channeling cooling fluid, an inlet port in communication with the passage, and an outlet port in communication with the passage, means for mounting at least one switching element to each of the first and second heat sinks, means for connecting the switching element attached to the first heat sink in series with the switching element attached to the second heat sink, and means, coupled to the inlet and outlet ports of the first and second heat sinks, for circulating cooling fluid through the passages of the first and second heat sinks to cool the switching elements.

In another aspect, the invention provides for a switching module comprising upper and lower mounting assemblies, each mounting assembly including a heat sink having a top surface, two thermally-conductive planar members forming a passage therebetween for channeling cooling fluid, an inlet port in communication with the passage, and an outlet port in communication with the passage, a first conductive member laminated to the top surface of the heat sink with a dielectric material, a second conductive member laminated to the first conductive member with a dielectric material, a plurality of thermally-conductive substrates attached to the top surface of the heat sink, a plurality of transistors attached to the heat sink via the plurality of substrates, each transistor having a collector connected to the first conductive member and an emitter connected to the second conductive member, means for connecting the second conductive member of the lower mounting assembly with the first conductive member of the upper mounting assembly, means for connecting the first conductive member of the lower mounting assembly to a positive voltage source, means for connecting the second conductive member of the upper mounting assembly to a common ground member, and means, communicating with the inlet and outlet ports of the heat sinks of the upper and lower mounting assemblies, for circulating cooling fluid through the heat sinks.

In a further aspect, the invention provides for a switching module assembly comprising a pair of switching modules, each switching module comprising upper and lower heat sinks, each heat sink having a passage for channeling cooling fluid, an inlet port in communication with the passage, and an outlet port in communication with the passage, at least one switching element attached to each of the upper and lower heat sinks, means for connecting the switching element attached to the upper heat sink in series with the switching element attached to the lower heat sink, and means for joining the upper heat sink with the lower heat sink in a spaced, parallel relationship; means, communicating with the inlet and outlet ports of the heat sinks of the pair of switching modules, for circulating cooling fluid through the heat sinks; and means for joining the pair of switching modules in an opposed, parallel relationship so that the lower heat sink of one of the modules faces the lower heat sink of the other module.

It is to be understood that both the foregoing general description and the following detailed description are exemplary and explanatory and are intended to provide further explanation of the invention as claimed.

BRIEF DESCRIPTION OF DRAWINGS

The accompanying drawings, which are included to provide a further understanding of the invention and are incorporated in and constitute a part of this specification, illustrate a presently preferred embodiment of the invention and, together with the description, serve to explain the principles of the invention. In the drawings:

FIG. 9 is a plan view of collector and emitter plates of the switching module of FIG. 4.

DETAILED DESCRIPTION

Reference will now be made in detail to a present preferred embodiment of the invention, an example of which is illustrated in the accompanying drawings.

Figure 1:
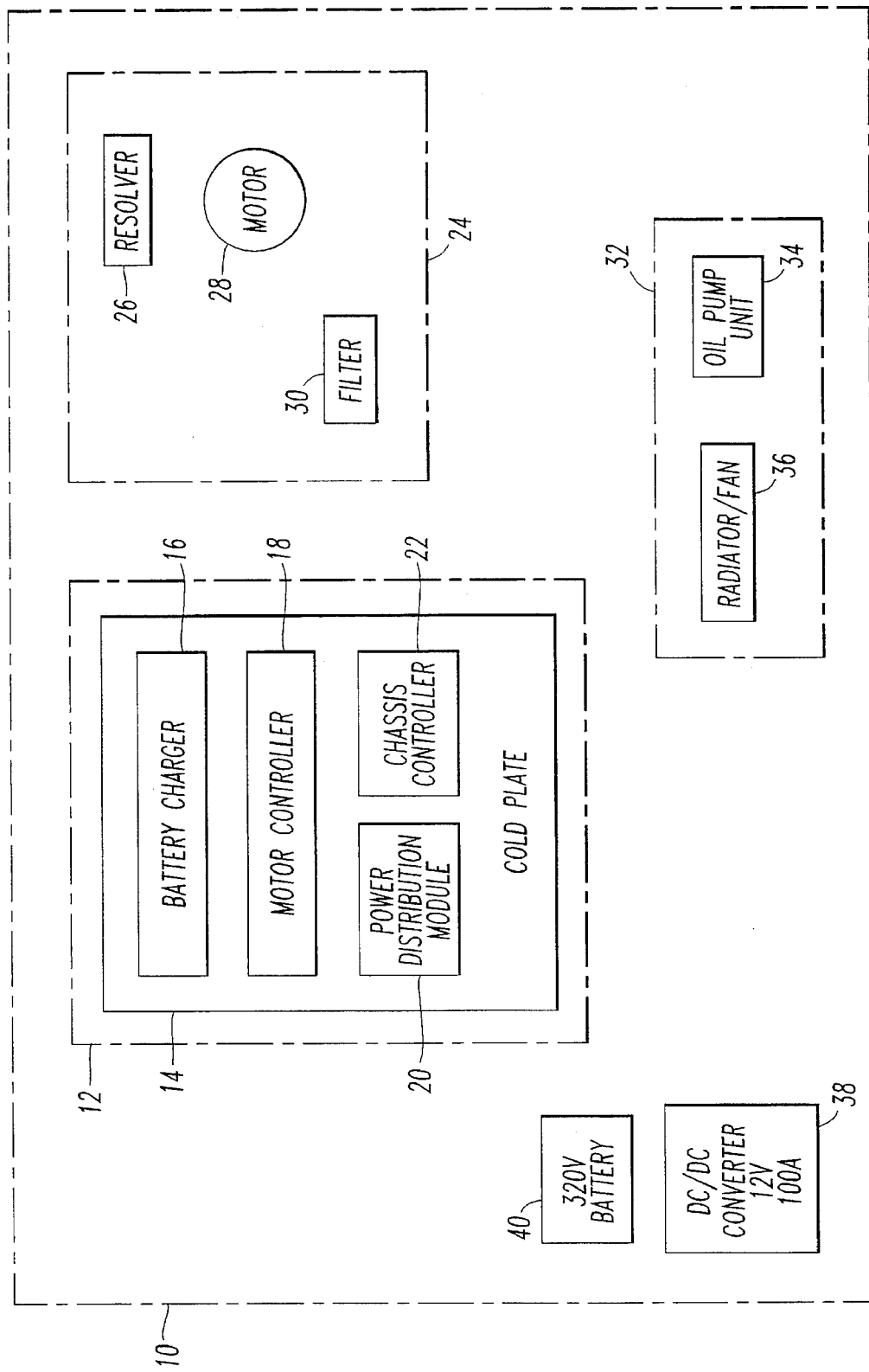
FIG. 1 is a block diagram of an electric vehicle propulsion system incorporating a switching module of the present invention.

As shown in FIG. 1, there is provided an electric vehicle propulsion system 10 comprising a system control unit 12, a motor assembly 24, a cooling system 32, a battery 40, and a DC/DC converter 38. The system control unit 12 includes a battery charger 16, a motor controller 18, a power distribution module 20, and a chassis controller 22. The motor assembly 24 includes a resolver 26, a motor 28, and a filter 30. The cooling system 32 includes an oil pump 34 and a radiator/fan 36.

The motor controller 18 uses switching circuits and other components to apply drive currents to windings of the motor 28. An exemplary embodiment of the motor controller is shown in FIGS. 2 and 3.

Figure 2:
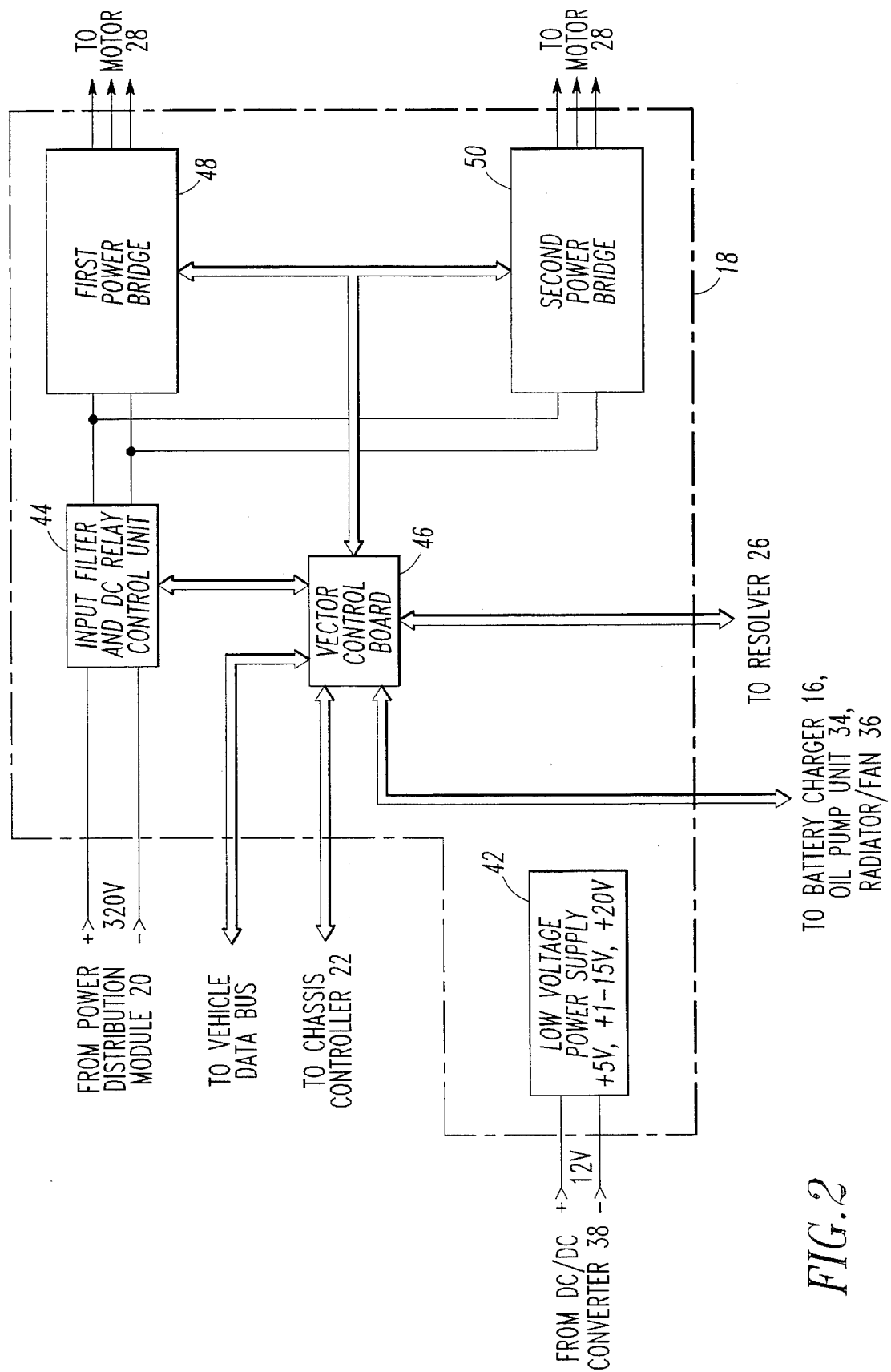
FIG. 2 is a functional diagram of the motor controller of the electric vehicle propulsion system of FIG. 1.

As shown in FIG. 2, the motor controller 18 includes a low voltage power supply 42, an input filter and DC relay control unit 44, a vector control board 46, and first and second power bridges 48 and 50, respectively. As shown in FIG. 3, the first power bridge 48 includes three IGBT switching circuits 52a, 52b, and 52c and the second power bridge 50 includes three IGBT switching circuits 53a, 53b, and 53c. The IGBT switching circuits 52a, 52b, and 52c apply drive currents to windings A1, B1, and C1, respectively, of the motor 28. Similarly, the IGBT switching circuits 53a, 53b, and 53c apply drive currents to windings A2, B2, and C2, respectively, of the motor 28.

Figure 3:
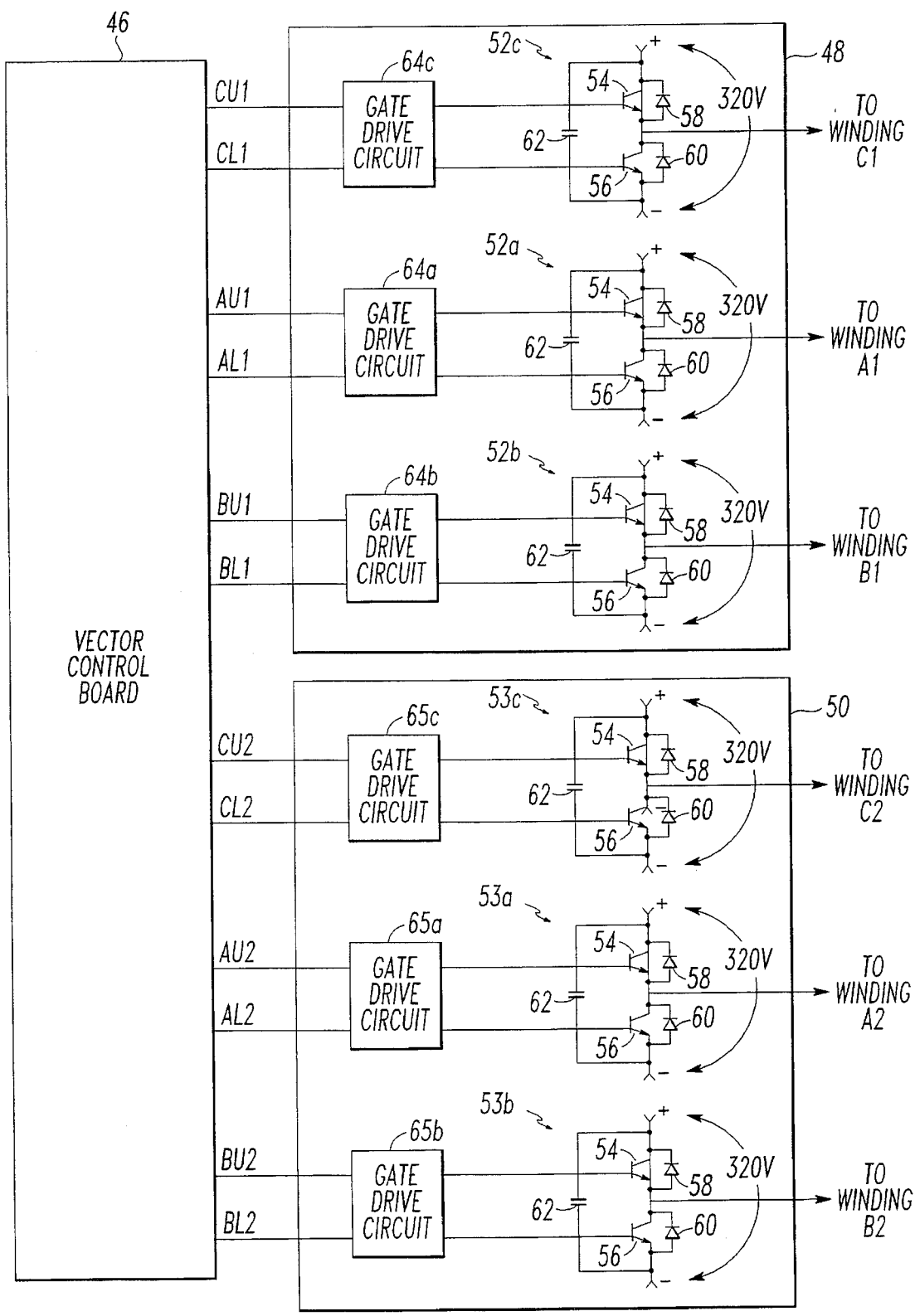
FIG. 3 is a schematic diagram of the power bridges of the motor controller of FIG. 2.

Each of the IGBT switching circuits 52a, 52b, 52c, 53a, 53b, and 53c includes IGBTs 54 and 56, respectively, diodes 58 and 60, respectively, and a capacitor 62 connected as shown in FIG. 3. Preferably, the IGBT switching circuits 52a, 52b, 52c, 53a, 53b, and 53c are all identical such that each of the first and second power bridges 48 and 50, respectively, provides half the total drive current to the windings of the motor 28. The IGBT switching circuits 52a, 52b, 52c, 53a, 53b, and 53c can be replaced with other switching circuits known in the art.

As also shown in FIG. 3, the first power bridge 48 further includes three gate drive circuits 64a, 64b, and 64c and the second power bridge 50 further includes three gate drive circuits 65a, 65b, and 65c. The gate drive circuits 64a, 64b, and 64c receive pulse-width-modulated (PWM) voltage waveforms in the form of gate drive signals AU1 and AL1, gate drive signals BU1 and BL1, and gate drive signals CU1 and CL1, respectively, from the vector control board 46. Likewise, the gate drive circuits 65a, 65b, and 65c receive PWM voltage waveforms in the form of gate drive signals AU2 and AL2, gate drive signals BU2 and BL2, and gate drive signals CU2 and CL2, respectively, from the vector control board 46. The gate drive circuits 64a, 64b, and 64c and the gate drive circuits 65a, 65b, and 65c level-shift the received gate drive signals and apply the level-shifted gate drive signals to the IGBT switching circuits 52a, 52b, 52c, 53a, and 53c as shown in FIG. 3 to drive the IGBT switching circuits 52a, 52b, 52c, 53a, 53b, and 53c. It is contemplated that each of the gate drive circuits 64a, 64b, 64c, 65a, 65b, and 65c can comprise, for example, a Fuji EXB841 Gate Drive Hybrid or other similar device known in the art.

Although FIG. 3 illustrates switching circuits composed of one IGBT 54 and one IGBT 56, a switching circuit may include several IGBTs 54 connected in parallel and several IGBTs 56 connected in parallel for high power applications.

Figure 4:
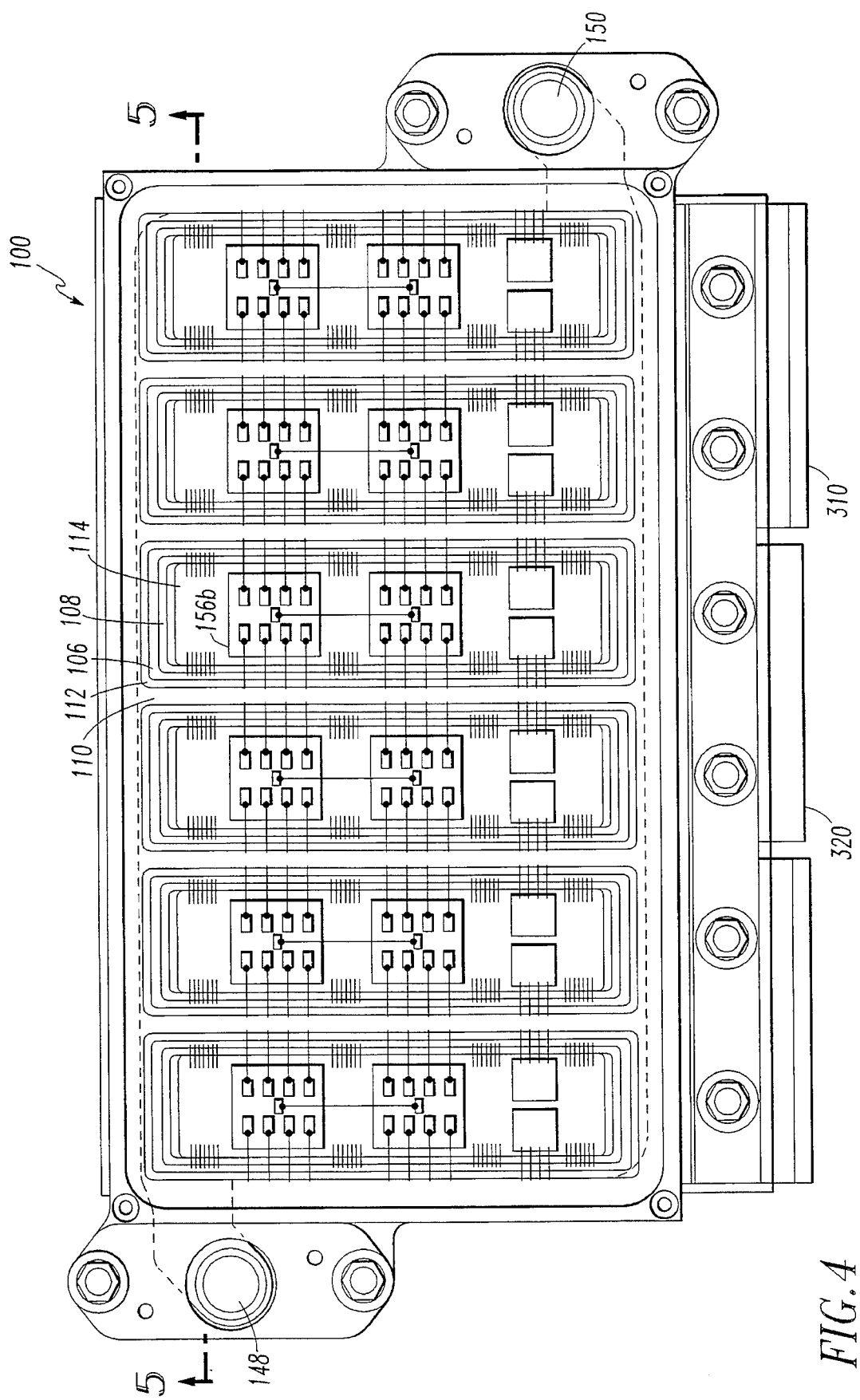
FIG. 4 is a plan view of a switching module for the motor controller of FIG. 2 in accordance with a preferred embodiment of the invention.
Figure 5:
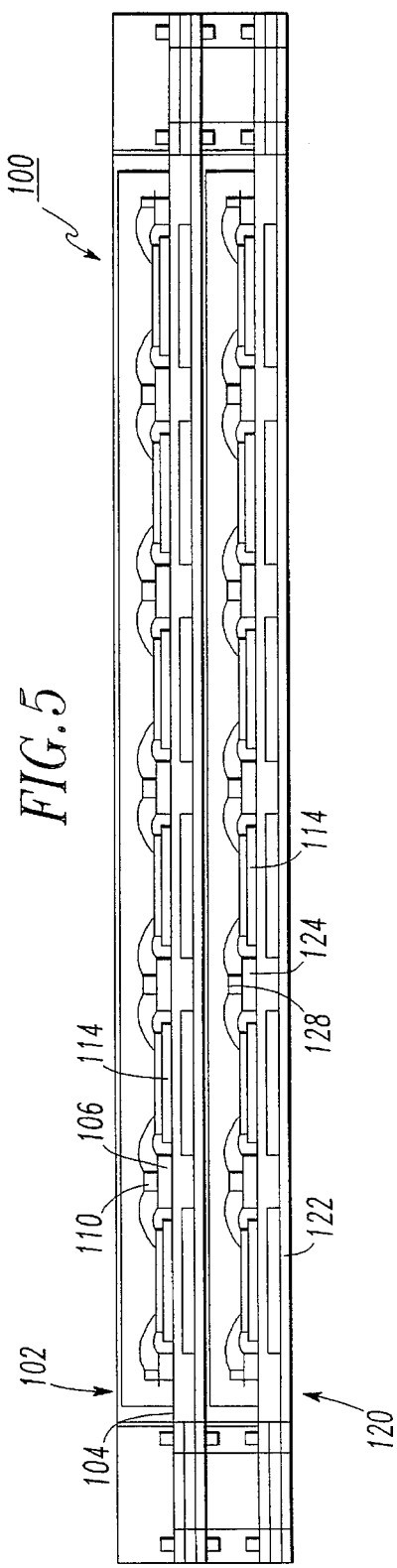
FIG. 5 is a cross-sectional view of the switching module of FIG. 4.

An exemplary embodiment of the switching module of the present invention is shown in FIGS. 4 and 5, and is designated generally by reference numeral 100. The switching module includes upper and lower mounting assemblies, each mounting assembly having a heat sink, a first conductive member laminated to the top surface of the heat sink with a dielectric material, a second conductive member laminated to the first conductive member with a dielectric material, a plurality of thermally-conductive substrates attached to the top surface of the heat sink, and a plurality of transistors attached to the heat sink via the plurality of substrates.

Figure 6A:
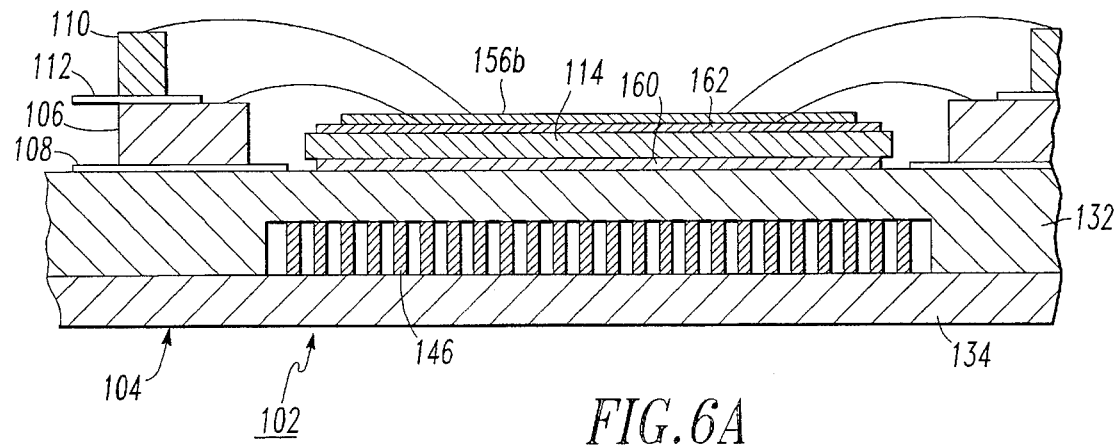
FIGS. 6A and 6B are partial sectional views of embodiments of the switching module of FIG. 4.
Figure 11:
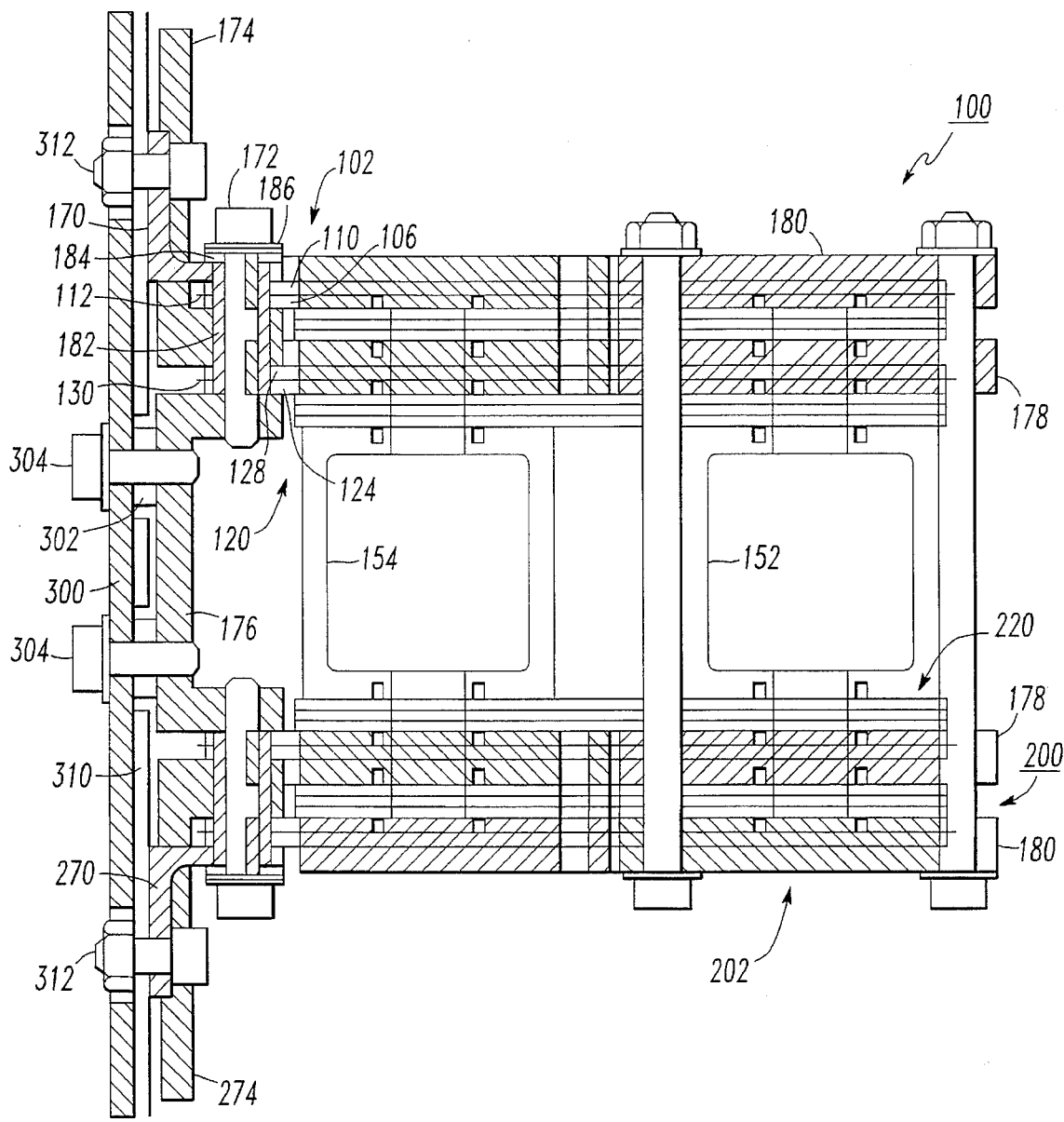
FIG. 11 is a cross-sectional view of a pair of switching modules taken along the lines 11—11 of FIG. 10.

As shown in FIGS. 5 and 6A, upper mounting assembly 102 includes a heat sink 104, a first conductive member or collector plate 106 laminated to the top surface of the heat sink 104 with a dielectric layer 108, a second conductive member or emitter plate 110 laminated to the collector plate with a second dielectric layer 112, and six thermally-conductive substrates 114 attached to the top surface of the heat sink. Similarly, as shown in FIGS. 5 and 11, lower mounting assembly 120 also includes a heat sink 122, a collector plate 124, a dielectric layer (not shown) similar to dielectric layer 108, an emitter plate 128, a second dielectric layer 130, and six thermally-conductive substrates 114.

As shown in FIG. 6A, each heat sink includes an upper planar member 132 and a lower planar member 134 that are joined together by brazing. When the upper and lower planar members are joined, they define a passage therebetween for channeling cooling fluid, such as water or oil. The upper and lower planar members are preferably composed of aluminum or other thermally-conductive metal, such as copper.

Figure 7:
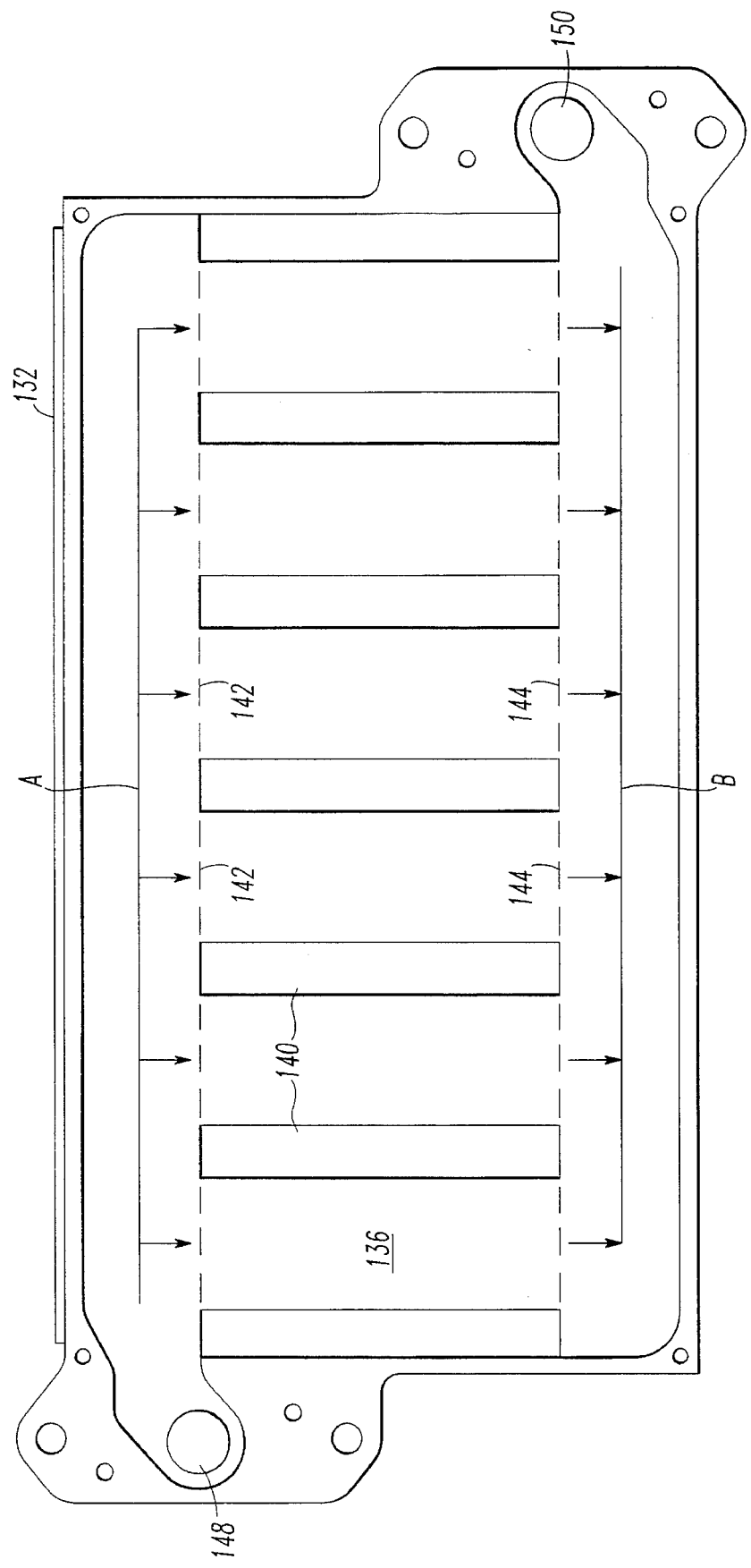
FIG. 7 is a bottom view of an upper planar member of the switching module of FIG. 4.

As shown in FIG. 7, the upper planar member 132 preferably includes a plurality of grooves 136 and lands 140, while the planar member 134 is flat. When the lands 140 of the upper planar member are brazed to the flat surface of the lower planar member, the upper and lower planar members form a plurality of parallel passages for allowing coolant to flow therebetween. Although FIG. 7 illustrates six parallel passages, the number of passages is variable depending upon the number of substrates attached to the heat sink, as will be discussed below. Each passage has an inlet 142 and an outlet 144.

As shown in FIG. 6A, fins 146 are secured to or made part of the upper planar member and extend into the parallel passages to increase heat transfer between the switching elements and the cooling fluid as it passes through the heat sink. The fins can be made of copper or other thermally-conductive material.

The heat sinks also include an inlet port 148 and an outlet port 150 that communicate with inlet and outlet manifolds 152 and 154 respectively to provide cooling fluid to the heat sinks, as shown in FIGS. 4, 5, 7, and 11. Cooling fluid is circulated through the heat sinks via the inlet and outlet manifolds by a pump, such as oil pump unit 34 shown in FIG. 1, or a separate circulation system that is well known in the art. As shown by paths A and B in FIG. 7, coolant enters the inlet port 148 and the inlet 142 of each parallel passage and exits via the outlet 144 of each passage and outlet port 150 so that the coolant temperature at each inlet of the parallel passages is substantially the same. The flow rate through each passage is the same because the pressure drop across each passage is the same.

Figure 10:
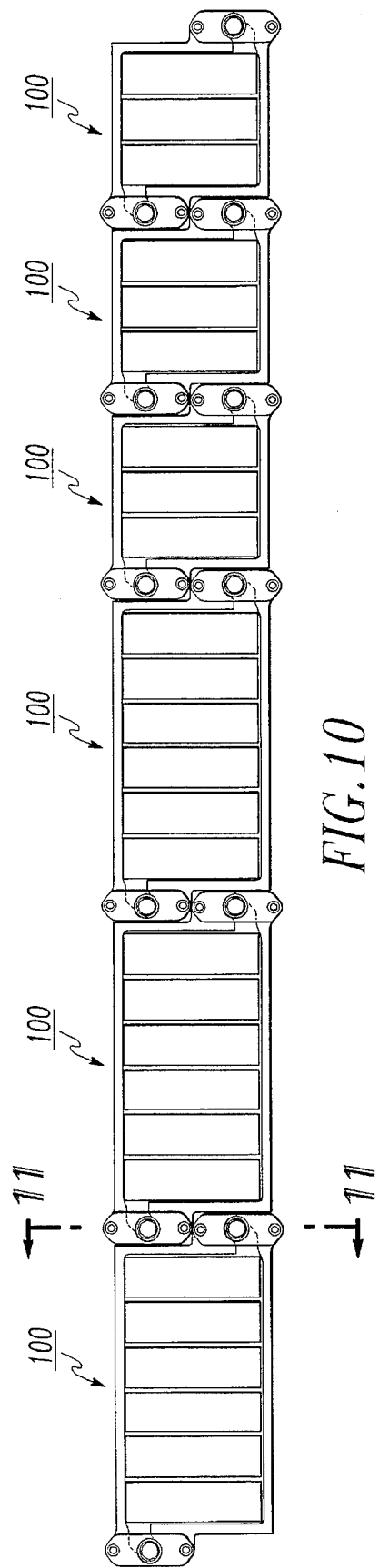
FIG. 10 is a plan view of several switching modules, as shown in FIG. 4, nested together.

As shown in FIG. 4, the inlet and outlet ports 148, 150 are arranged so that the switching modules can be nested together as shown in FIG. 10. FIG. 10 shows three small modules (with three transistor assemblies each) and three large modules (with six transistor assemblies each) nested together.

Figure 8A:
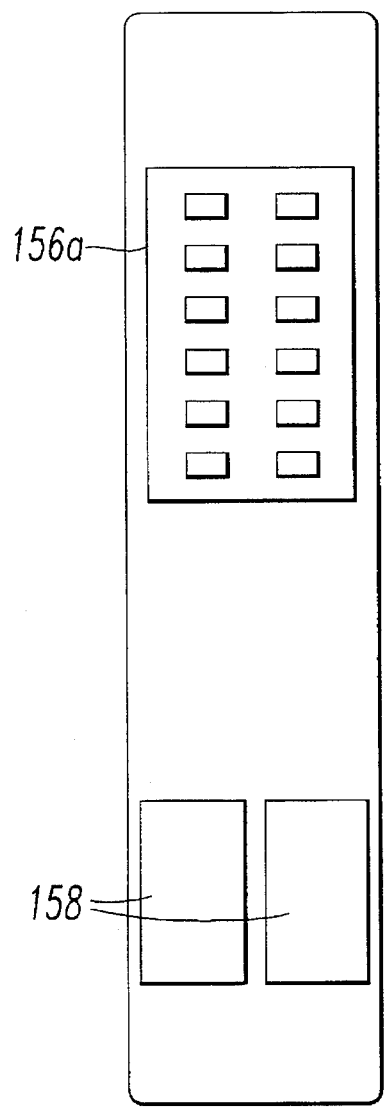
FIGS. 8A and 8B are plan views of embodiments of the substrates of the switching module of FIG. 4.
Figure 8B:
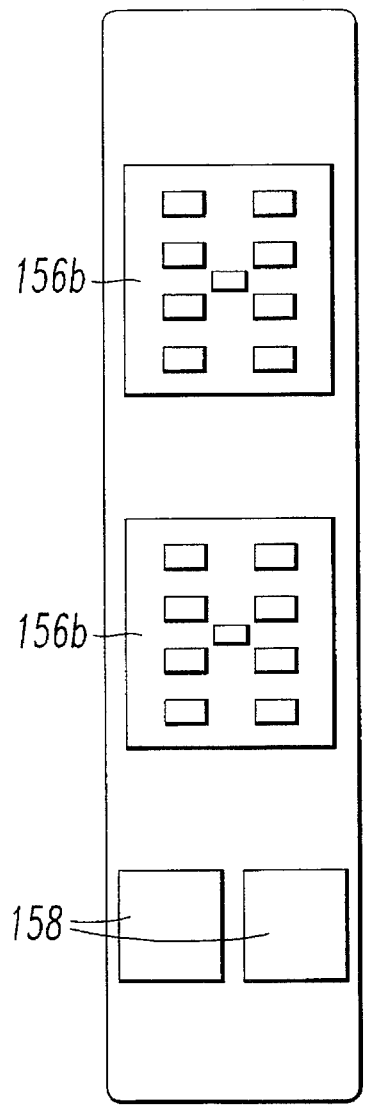

As shown in FIGS. 8A and 8B, the IGBTs 54, 56 are incorporated into transistor dies 156a and 156b and diodes 58, 60 are incorporated into diode dies 158. As shown in FIG. 8A, an IGBT may be incorporated into one transistor die 156a, or, as shown in FIG. 8B, may be incorporated into two transistor dies 156b. Dies containing IGBT's 54 are attached to the heat sink 122 of the lower mounting assembly and dies containing IGBT's 56 are attached to the heat sink 104 of the upper mounting assembly, as shown in FIG. 5.

Figure 6B:
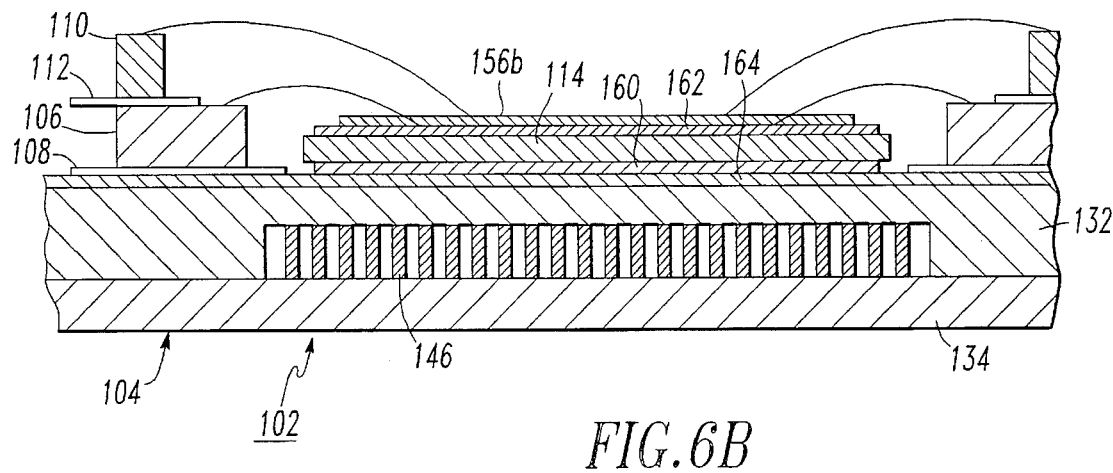

As shown in FIG. 6A, the substrates 114 supporting the transistor and diode dies are positioned on the heat sink above the parallel passages. A first metal layer 160, such as copper, is attached to the bottom surface of the substrate 114 and a second metal layer 162, such as copper, is attached to the top surface of the substrate 114. The transistor die 156b and the diode die 158 are attached to the second metal layer 162. The substrate 114, which is preferably composed of beryllium oxide, the two metal layers, the transistor die, and the diode die are attached as an assembly to the heat sink 104. In an alternative embodiment, as shown in FIG. 6B, an additional metal layer 164, preferably copper, is attached to the top surface of the heat sink before the substrate assembly is attached.

As shown in FIG. 6A, collector plate 106 is laminated to the top surface of the heat sink 104 with dielectric layer 108, which is preferably a dielectric preform adhesive. Since the emitter plate must be electrically insulated from the collector plate, the emitter plate 110 is laminated to the top of the collector plate with the second dielectric layer 112. The collector and emitter plates 124, 128 shown in FIG. 5 are attached to heat sink 122 in a similar fashion so that the upper and lower mounting assemblies are identical in structure.

The second metal layer 162 is electrically and mechanically attached to the bottom surface of the transistor die 156b. The second metal layer is also wirebonded to the collector plate 106 so as to electrically connect the bottom surface of the transistor die 156b to the collector plate. The emitter connection to the transistor die is on the top surface of the die in the form of a number of wirebonding pads, which are wirebonded to the emitter plate 110, as shown in FIGS. 4, 6A, and 6B.

The collector and emitter plates are laminated together so that current in one is balanced by an equal current in the other flowing in the opposite direction, thus helping to reduce the mutual inductance in these conductive plates. In a similar fashion, current in the collector wirebonds is matched by current in the emitter wirebonds traveling in the opposite direction.

As shown in FIG. 9, the collector plate 106 includes six rectangular cut-out portions for accommodating the mounting of the substrates onto the top surface of the heat sink 104. The second dielectric layer 112 is constructed in a similar fashion, but has cut-out portions of a slightly larger area. Similarly, the emitter plate 110 has cut-out portions of a slightly larger area than the dielectric layer 112 to form a layered structure as shown in FIGS. 6A, 6B, and 9. The first dielectric layer 108, which is not shown in FIG. 9, is similar in shape, but has cut-out portions slightly smaller than those of the collector plate.

The upper and lower mounting assemblies 102 and 120 shown in FIG. 5 are joined together as shown in FIG. 11. The collector and emitter plates of each mounting assembly are sized so that they protrude from a side of the heat sink. The emitter plate 110 is connected to a flange-shaped negative terminal 170 with screws 172 (only one shown). An L-shaped ac terminal 174 is disposed between the two mounting assemblies and held in contact with the collector plate 106 of the upper mounting assembly 102 and the emitter plate 128 of the lower mounting assembly 120 also with screws 172. Screws 172 also connect collector plate 124 of the lower mounting assembly 120 to a U-shaped positive bus bar 176.

The mounting assemblies are also separated by a pair of flanges 178 that are part of the inlet and outlet ports 148, 150. The flanges 178 have o-ring grooves on each surface for sealing the coolant flow. There is also a pair of outside flanges 180 which cap off the coolant flow channels.

In order to make the respective connections, the screws 172 must be insulated from the ac terminal 174 and the negative terminal 170. This is done with cylindrical spacers 182 and flat washer type spacers 184. In order to keep the assembly tight, the screws 172 preferably use several conical spring washers 186 and screw into locking helical inserts (not shown) installed in the positive bus bar 176. The second dielectric layers 112, 130 extend beyond the edges of the collector and emitter plates to provide a longer path for voltage margin.

It should be noted that the two mounting assemblies need not be permanently joined together, but rather they can be bolted together at the time of assembly to make the necessary connections to the bus bar, the negative terminal, and the ac terminal.

As also shown in FIG. 11, a second switching module 200, identical to the first switching module, can be added. In this case, the second switching module opposes the first (top) switching module 100 and is mounted on the opposite surfaces of the inlet and outlet manifolds 152, 154. Second switching module includes upper and lower mounting assemblies 202, 220.

The negative terminals 170, 270 and the positive bus bar 176 are connected to a positive rail of a voltage source and a common ground plane. The ac terminals 174, 274 are connected to an ac machine to supply the machine with electrical energy if it is acting as a motor or extract electrical energy from the machine if it is acting as a generator. A set of three switching modules is required to connect to a three-phase ac machine. The three switching modules are preferably on the same side of the manifolds 152, 154. The U-shaped bus bar 176 is bolted to the positive rail 300 with electrically-conductive spacers 302 and screws 304. The negative terminals 170, 270 are bolted to the common ground plane 310, which is attached to the positive rail 300 via an insulating layer (not shown), with screws 312. Finally, the ac terminals 174, 274 are connected to the ac rail 320, which is shown in FIG. 4.

The completed assembly represents a high-power switching device which can control high electric power by using liquid cooling placed close to the devices that generate heat.

It should be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

We claim:

1. Apparatus for cooling a switching circuit for an electric vehicle, wherein the switching circuit has at least two switching elements connected in series, the apparatus comprising:

a first heat sink having two thermally-conductive planar members forming a passage therebetween for channeling cooling fluid, an inlet port in communication with the passage, and an outlet port in communication with the passage;

a second heat sink having two thermally-conductive planar members forming a passage therebetween for channeling cooling fluid, an inlet port in communication with the passage, and an outlet port in communication with the passage;

means for mounting at least one switching element to the first heat sink and means for mounting at least one switching element to the second heat sink;

means for connecting the switching element attached to the first heat sink in series with the switching element attached to the second heat sink; and means, coupled to the inlet and outlet ports of the first and second heat sinks, for circulating cooling fluid through the passages of the first and second heat sinks to cool the switching elements.

2. The apparatus of claim 1, wherein the mounting means comprises an electrically insulating and thermally conductive substrate attached to each of the heat sinks.

3. The apparatus of claim 1, wherein one of the planar members of each of the first and second heat sinks comprises a plurality of grooves to form a plurality of parallel passages between the planar members of each of the heat sinks.

4. The apparatus of claim 3, wherein the mounting means comprises a plurality of substrates attached to each of the first and second heat sinks, wherein the plurality of substrates are positioned on the heat sinks above the plurality of parallel passages.

5. The apparatus of claim 3, wherein each of the plurality of parallel passages includes an inlet and an outlet, the inlets of the parallel passages communicating with the inlet port of the heat sink and the outlets of the parallel passages communicating with the outlet port of the heat sink so that an inlet temperature of the cooling fluid is substantially the same at each of the inlets of the parallel passages.

6. The apparatus of claim 1, further comprising thermally-conductive fins secured to at least one of the planar members and extending into the passage to facilitate heat transfer to the cooling fluid flowing through the passage.

7. The apparatus of claim 3, further comprising thermally-conductive fins secured to at least one of the planar members and extending into the passages to facilitate heat transfer to the cooling fluid flowing through the passages.

8. A fluid-cooled switching module for an electric vehicle, comprising:

upper and lower mounting assemblies, each mounting assembly including:

a heat sink having a top surface, two thermally-conductive planar members forming a passage therebetween for channeling cooling fluid, an inlet port in communication with the passage, and an outlet port in communication with the passage;

a first conductive member laminated to the top surface of the heat sink with a dielectric material;

a second conductive member laminated to the first conductive member with a dielectric material;

a plurality of thermally-conductive substrates attached to the top surface of the heat sink; and a plurality of transistors attached to the heat sink via the plurality of substrates, each transistor having a collector connected to the first conductive member and an emitter connected to the second conductive member;

a drive current terminal connecting the second conductive member of the lower mounting assembly with the first conductive member of the upper mounting assembly;

a bus bar connecting the first conductive member of the lower mounting assembly to a positive voltage source;

a negative terminal connecting the second conductive member of the upper mounting assembly to a common ground member; and means, communicating with the inlet and outlet ports of the heat sinks of the upper and lower mounting assemblies, for circulating cooling fluid through the heat sinks.

9. The module of claim 8, wherein the transistors are insulated gate bipolar transistors.

10. The module of claim 8, wherein a portion of each of the first and second conductive members protrudes from a side of the heat sink in each of the upper and lower mounting assemblies.

11. The module of claim 10, wherein the drive current terminal is disposed between the upper and lower mounting assemblies to contact the protruding portion of the second conductive member of the lower mounting assembly and contact the protruding portion of the first conductive member of the upper mounting assembly, the drive current terminal supplying a drive current to motor windings of the electric vehicle.

12. The module of claim 11, wherein the bus bar is secured to the protruding portion of the first conductive member of the lower mounting assembly.

13. The module of claim 12, wherein the negative terminal is secured to the protruding portion of the second conductive member of the upper mounting assembly.

14. The module of claim 13, wherein the drive current terminal, the bus bar, and the negative terminal are all disposed on a same side of the upper and lower mounting assemblies.

15. The module of claim 8, wherein the substrates are composed of beryllium oxide.

16. The module of claim 8, wherein each of the upper and lower mounting assemblies further comprises a first metallic layer disposed between the substrates and the top surface of the heat sink.

17. The module of claim 16, wherein each of the upper and lower mounting assemblies further comprises a second metallic layer disposed between the transistors and the substrates.

18. The module of claim 17, wherein each of the upper and lower mounting assemblies further comprises a third metallic layer disposed between the top surface of the heat sink and the first metallic layer, and between the top surface of the heat sink and the first conductive member.

19. A fluid-cooled switching module assembly for an electric vehicle, comprising:

a pair of switching modules, each switching module comprising:

upper and lower heat sinks, each heat sink having a passage for channeling cooling fluid, an inlet port in communication with the passage, and an outlet port in communication with the passage;

at least one switching element attached to the upper heat sink and at least one switching element attached to the lower heat sink;

a drive terminal connecting the switching element attached to the upper heat sink in series with the switching element attached to the lower heat sink; and means for joining the upper heat sink with the lower heat sink in a spaced, parallel relationship;

means, communicating with the inlet and outlet ports of the heat sinks of the pair of switching modules, for circulating cooling fluid through the heat sinks; and means for joining the pair of switching modules in an opposed, parallel relationship so that the lower heat sink of one of the modules faces the lower heat sink of the other module.

20. The assembly of claim 19, wherein the switching elements are insulated gate bipolar transistors, each having a collector and an emitter.

21. The assembly of claim 19, further comprising:

a bus bar for connecting the switching elements attached to the lower heat sinks of the pair of switching modules to a positive terminal of a voltage source; and a negative terminal for connecting the switching elements attached to the upper heat sinks of the pair of switching modules to a common ground member.

22. The assembly of claim 20, wherein each of the pair of switching modules further comprises a collector plate laminated to each of the upper and lower heats sink with a thermally-conductive, dielectric material, the collector plate electrically connected to the collectors of the transistors, and an emitter plate laminated to the collector plate with a thermally-conductive, dielectric material, the emitter plate electrically connected to the emitters of the transistors, wherein a current in the collector plate is balanced by an opposite flowing current in the emitter plate.

23. The assembly of claim 21, wherein the drive terminal, the bus bar, and the negative terminal are all disposed on a same side of the pair of switching modules when the modules are joined.

* * * * *